United States Patent [19]

Todorof et al.

[11] Patent Number: 4,830,678
[45] Date of Patent: May 16, 1989

[54] LIQUID-COOLED SEALED ENCLOSURE FOR CONCENTRATOR SOLAR CELL AND SECONDARY LENS

[76] Inventors: William J. Todorof, 1001 W. 17th St., Costa Mesa, Calif. 92627; Mark Murphy, 34061 Aurelio St., Dana Point, Calif. 92629

[21] Appl. No.: 57,886

[22] Filed: Jun. 1, 1987

[51] Int. Cl.$^4$ .............................................. H01L 31/04
[52] U.S. Cl. .................................. 136/259; 250/239; 357/30; 357/79; 357/82
[58] Field of Search ....................... 136/259, 246, 248; 250/239; 357/30 Q, 30 R, 79-82

[56] References Cited

U.S. PATENT DOCUMENTS

| | | | |
|---|---|---|---|
| 4,055,761 | 10/1977 | Shimomura | 250/239 |
| 4,280,853 | 7/1981 | Palazzetti et al. | 136/246 |
| 4,658,086 | 4/1987 | McLeod et al. | 136/249 TJ |

Primary Examiner—Aaron Weisstuch
Attorney, Agent, or Firm—Parmelee, Bollinger & Bramblett

[57] ABSTRACT

The sealed enclosure for an electrical power generation solar concentrator holds and protects the photovoltaic cell from ambient conditions and thermal shock, while multiple fingers of front and rear electrical contact terminals accommodate thermal expansion and contraction of the cell and minimize mechanical stresses on the cell. This sealed enclosure also holds the secondary lens and protects the internally reflective truncated conical rear surface of the lens. A base member has a socket for receiving the cell and its associated front and rear terminal members together with an insulator alignment disc having an opening receiving the cell and for aligning the cell with the axis of the concentrator. A front housing removably screws onto the base member with an inturned front lip gripping a peripheral flange on the secondary lens, thereby aligning it with the cell and firmly pressing it against the cell front for causing thermal mass and inertial of the lens to moderate temperature changes in the cell. The base member screws onto a pedestal of a finned heat sink of good thermal conductivity fitting into a pre-punched hole in a panel of the concentrator, thus aligning the sealed enclosure with the concentrator axis. The pressure of the secondary lens on the cell causes the cell back to press onto its multiple-fingered rear contact member of good electrical and thermal conductivity which in turn is pressing against a thin electrical insulator in good thermal conductivity with the heat sink pedestal.

11 Claims, 2 Drawing Sheets

LIQUID-COOLED SEALED ENCLOSURE FOR CONCENTRATOR SOLAR CELL AND SECONDARY LENS

FIELD OF THE INVENTION

The present invention is in the field of solar concentrators having photovoltaic cells for generating electrical power and more particularly to those solar concentrators having primary and secondary lenses. The illustrative embodiments of the invention have a liquid-cooled heat sink for the photovoltaic cell.

BACKGROUND

Electrical generation solar concentrators are subjected to high insolation, and at night or during obstruction of the sun by a cloud they become cooled. Liquid-cooled solar concentrator cells become cooled very rapidly during cloud obstruction during an otherwise clear summer day, and then re-heat very rapidly again when the concentrated solar radiation again impinges on the front face of the cell. Thus, the cell and its electrical contacts are subjected to thermal and mechanical stresses, which can lead to early failure during operation. Also, solar concentrators are often exposed to severe ambient weathering conditions in geographic regions of high insolation.

SUMMARY OF THE DISCLOSURE

Among the objects of the present invention are to hold and to protect a photovoltaic cell and its associated electrical contacts in a solar concentrator having a secondary lens by providing a conveniently assembled sealed enclosure for the cell and its secondary lens.

An advantage of the illustrative embodiments of this invention is that the secondary lens and the solar cell become aligned with each other and with the axis of the solar concentrator as a whole by virtue of their convenient screw threaded assembly arrangement.

The sealed enclosure in an electrical power generation solar concentrator holds and protects the photovoltaic cell, protecting the cell from ambient conditions and from thermal shock, while the multiple fingers of the front and rear electrical contact terminals accommodate thermal expansion and contraction of the cell and minimize mechanical stresses on the cell. This sealed enclosure also holds the secondary lens and protects the internally reflective truncated conical rear surface of the lens.

The housing of this sealed enclosure includes a base member having a socket for receiving the photovoltaic cell and its associated front and rear terminal members together with an insulator alignment disc which has an opening for receiving the cell. This alignment disc fits freely but precisely into the socket for inherently and conveniently aligning the cell with the axis of the concentrator during convenient assembly.

The sealed enclosure includes a front housing which removably screws onto the base member with an in-turned front lip which grips a peripheral flange on the secondary lens, thereby directly aligning the lens with the solar cell. This downwardly pressing gripping lip of the front housing firmly presses the lower surface of the lens against the cell front for causing the thermal mass and thermal inertia of the lens advantageously to moderate temperature changes in the front face of the cell.

The base member of the sealed enclosure screws onto pedestal of a finned heat sink of metal of good thermal conductivity fitting into a pre-punched hole in a panel or tray of the concentrator, thus aligning the sealed cell-holder enclosure with the axis of the concentrator as a whole. In effect, the sealed enclosure holding the cell and its contact members provides a conveniently handleable package.

The pressure of the secondary lens on the cell front in turn causes the back of the cell to press down onto its multiple-fingered rear contact member, which is formed of metal of good electrical and thermal conductivity and which in turn is thereby pressed down against a thin electrical insulator in good thermal conductivity relationship with a planar top surface or seat on top of the heat sink pedestal for withdrawing heat into the finned heat sink which is shown as liquid-cooled.

The multiple tapered fingers of the front contact member are each bowed up into an arch forming a flexible knuckle such that the whole pattern of these front contact fingers appears somewhat like an assemblage of spider legs. This arched knuckle configuration of the contact fingers accommodates radial and axial expansion of the cell to minimize mechanical stress on the cell and its contacts. The sealed enclosure thus is readily and conveniently assembled and disassembled. The terminal legs of the front and rear contact members have crimped-on electrical terminals for enabling convenient electrical connection using insulated wires, as contrasted with custom-made electrical bus bar arrangements.

As used herein the term "radial" is intended to mean in a direction perpendicular to the main axis of the solar concentrator, and "axial" is intended to mean in a direction parallel with that axis.

The term "forward", "front", "upward", or "top", or similar wording is intended to mean in a direction toward the sun during operation, and conversely "rearward", "rear", "downward", "bottom", or similar wording is intended to mean in a direction away from the sun. These words are used for ease of explanation and for ease of understanding in the specification and claims, but they are not intended as structural limitations. In other words, apparatus and structure upon which the claims are readable when in operation facing toward the sun are still considered to be within the scope of the claims when facing away from the sun.

BRIEF DESCRIPTION OF THE DRAWINGS

The foregoing and other aspects, objects, features and advantages of the invention will become more fully understood from the following description of a preferred embodiment of the invention, as illustrated in the accompanying drawings, in which like reference characters refer to like parts throughout the different views. The drawings are not necessarily to scale, emphasis being placed upon illustrating the principles of the invention.

FIG. 1A is a partial section on line A—A.

DETAILED DESCRIPTION OF PREFERRED EMBODIMENT

Figure 1:
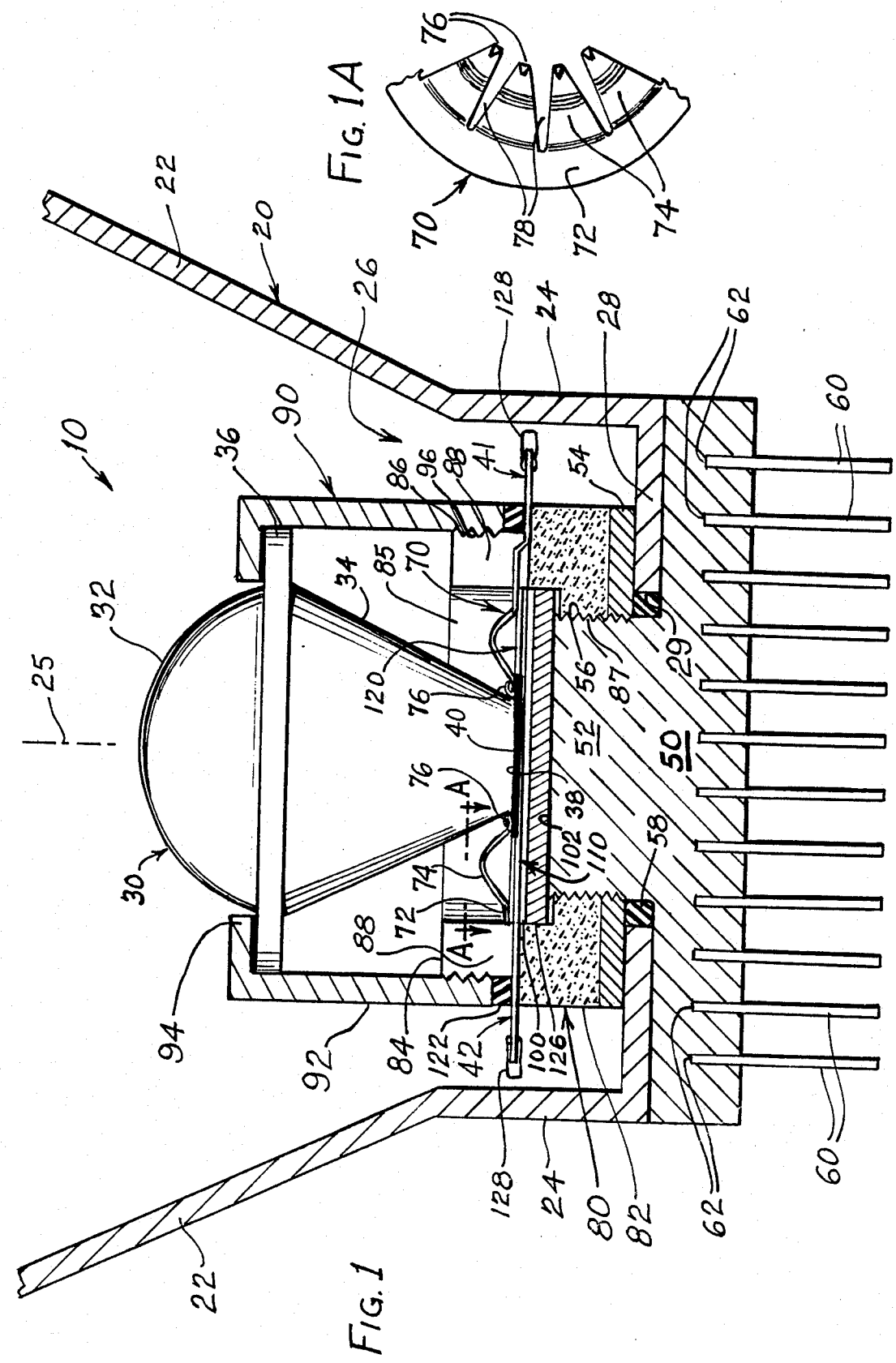
FIG. 1 is an enlarged elevational sectional view of a sealed photovoltaic cell holder shown mounted in the rear of a solar concentrator and having liquid-cooled fins attached to the heat sink.
Figure 2:
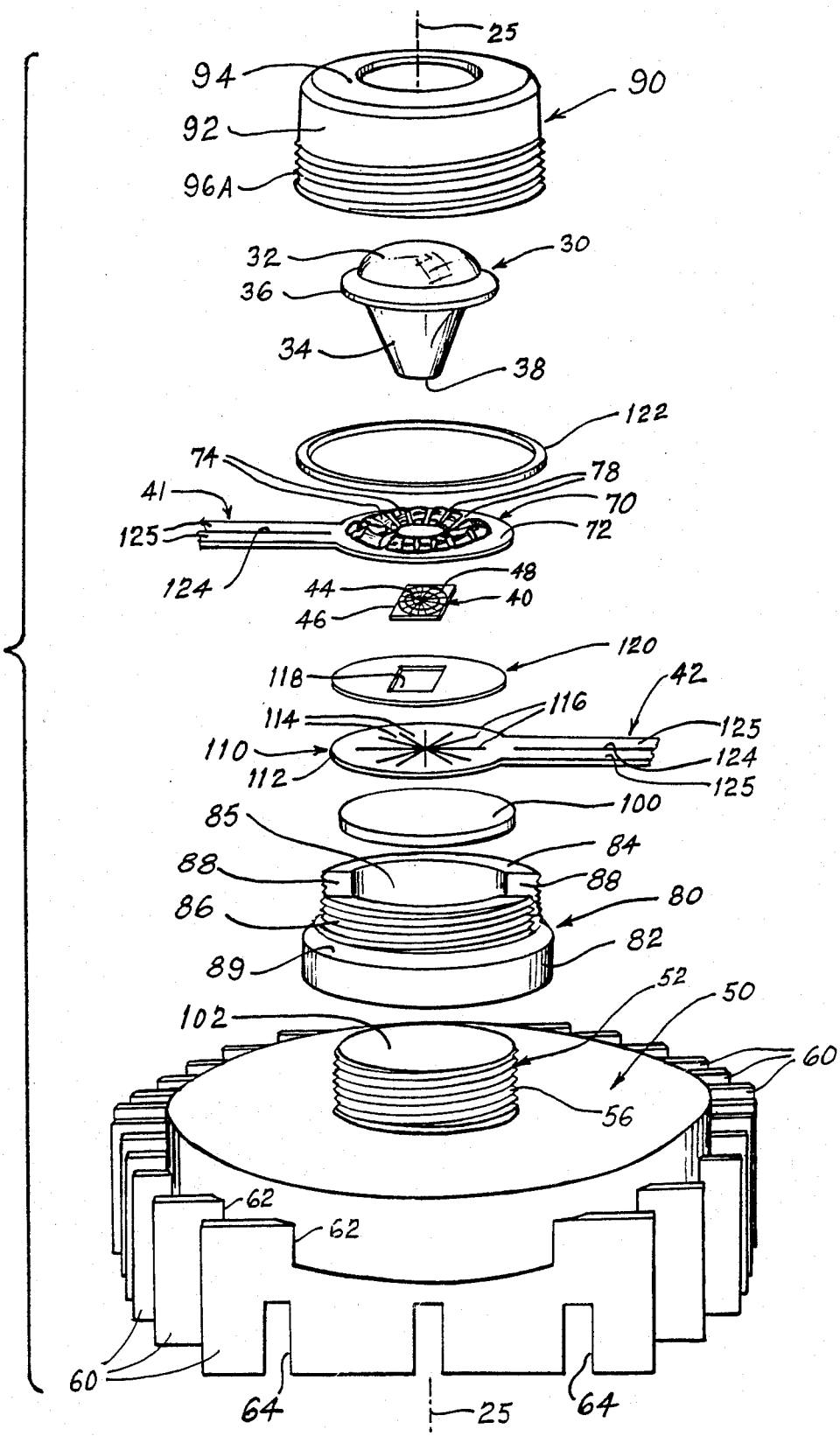
FIG. 2 is an exploded perspective view of the cell holder components shown in FIG. 1.

With reference to FIGS. 1 and 2, there is generally indicated at 10 a sealed enclosure 10 for a secondary lens and photovoltaic cell mounted in the bottom of a point-focus Fresnel lens solar concentrator 20. Extending across the front of this concentrator 20 and positioned above and directly in front of this concentrator 20 is a converging lens, the primary lens (not shown), which is of the point-focus Fresnel type. This primary lens has an axis 25 and causes the sun's rays to be converged downwardly and inwardly toward the axis 25 of this concentrator 20, thus the sun's rays are focused toward a secondary lens 30 which further converges and concentrates the sun's rays onto a photovoltaic cell 40 having front and rear electrical output leads 41 and 42 respectively extending in opposite directions from the cell 40.

This cell 40 is concentric with axis 25 and is protected by being mounted in the sealed enclosure 10. This cell 40 is positioned in good heat conduction relationship with (but is electrically insulated from) a relatively massive heat sink 50 formed of a metal of good heat conductivity, for example of aluminum, and having numerous liquid-cooled vanes or fins 60 attached to this heat sink 50. These fins 60 are also formed of aluminum and are tightly fitted into slots 62 in the heat sink 50 in good heat conductivity relationship with the heat sink for dissipating heat into the liquid coolant being circulated past these fins 60.

The solar cell 40 may be any suitable cell which is capable of being assembled into the sealed enclosure 10 with the front and rear terminals 41, 42. The presently preferred example of such a cell is a bi-facial contact planar junction concentrator solar cell 40 manufactured by and available from Applied Solar Energy Corporation of City of Industry, California, or such a cell of somewhat enhanced efficiency is obtainable from Dr. M. A. Green, University of South Wales, Australia. This cell 40 has a round active area 44 on a square silicon body 46. The front contact region 48 extends around the perimeter of the round active area 44.

In order to provide good electrical connection to the front contact region 48 of the cell, there is a front terminal member 70 having a circular margin 72 of generally annular shape. In other words, there is a peripheral circular ring 72. This terminal member 70 is formed from a sheet of metal of high electrical conductivity, for example oxygen-free high conductivity copper. Extending radially inwardly from the inner edge of the annular peripheral ring 72 and integrally connected to this ring 72 are a plurality of identical contact fingers 74, for example most preferably in the range from twelve to eighteen fingers. These relatively numerous fingers 74, preferred to be at least ten in number provide redundancy for continuing satisfactory operation of the solar cell in case one or two of the soldered tips 76 happen to become disconnected from the cell's front contact region 48 during operation. Moreover, these relatively numerous contact fingers spread and distribute the electrical current relatively uniformly throughout the front contact region 48 for minimizing the voltage drop (voltage loss) due to conduction losses within the cell and its terminal.

As seen most clearly in FIG 1A, which shows a partial plan view of a portion of the front terminal member 70, these radial contact fingers 74 are tapered inwardly with tips 76 bent up and back upon themselves as seen in FIG. 1. These contact tips 76 are each individually soldered to the front contact region 48 the cell 40. The fingers 76 are separated from each other by radial slots 78 so that these fingers 76 advantageously can flex individually and independently of each other.

For accommodating thermal expansion of the solar cell 40 and for minimizing stress on this cell and on its contacts due to thermal expansion and contraction, the radial tapered fingers 76 are curved and bowed to be arched upwardly like a flexible bent knuckle, thereby readily yielding to radial and axial movement of the finger tip 76 which may occur during heating or cooling.

The solar concentrator 20 includes side walls 22, for example of aluminum, which diverge in the forward (upward) direction for supporting the primary Fresnel lens (not shown) previously discussed and which is concentric with the axis 25. The rear (lower) portions 24 of these side walls 22 are shaped parallel to each other for defining a receptacle region 26 into which is mounted the sealed enclosure 10. These lower portions 24 of the side walls 22 are connected by a flat bottom panel or tray 28 having a central mounting hole 29.

The heat sink 50 has a forwardly (upwardly) projecting externally threaded stud 52 integral with the heat sink 50 and mounted by extending forward through the hole 29. This stud 52 is anchored to the bottom panel or tray 28 by a jam nut 54 screwed down tightly on the external threads 56, with an O-ring seal 58 or gasket ring encircling the base of the stud 52 inside of the hole 29 for sealing the receptacle region 26 of the solar concentrator.

The converging secondary lens 30 includes a convex front surface 32 and a truncated conical rear surface 34 which is polished for providing internal reflection of the converging sun's rays. Thus, any rays which happen to be slightly missing the solar cell 40 due to slight tracking or aiming error of the solar concentrator 20 with respect to the sun's position are internally reflected by the conical surface 34 down onto the cell 40. At the junction of the convex front 32 and conical rear surface 34, this secondary lens 30 is encircled by a peripheral flange 36. Its conical rear surface 34 terminates a flat bottom surface 38 closely adjacent to the cell's round active region 44. There is a very thin layer of optical coupling grease between the front surface of the cell 40 and the lens bottom surface 38 for minimizing reflection at this interface between lens and cell. The bottom lens surface 38 may be very slightly concave, because this lens surface is pressed down firmly against the cell as will be explained later, and a very slight upwardly arching concavity accommodates the thin layer of optical coupling grease and applies the contact pressure of the lens only around the perimeter of the cell's active region 44.

The cell-holding sealed enclosure 10 includes a base member 80 having a rear peripheral flange 82 and a forwardly projecting annular wall 84, which may be called the socket wall, externally threaded at 86 and having two diametrically opposed clearance notches 88. These notches 88 have a depth in the axial direction equal to the height of the socket wall and thus the bottom of each notch is level with the top surface 89 of the base flange 82. These clearance notches 88 receive the respective output terminals 41 and 42. The annular wall 84 encircles and defines a socket 85. As seen in FIG. 1 the base member 80 has an axially extending threaded hole 87 concentric with the axis 25 into which is screwed the threaded stud 52. The base member 80 is formed of heat resistant and electrically insulating material, preferred to be ceramic for durability, for example alumina.

The cell-holding sealed enclosure 10 also includes a front housing 90, of heat resistant and heat conducting material, for example aluminum, having a circular cylindrical side wall 92 with an inturned front lip 94 which seats on the secondary lens flange 36. This housing side wall 92 is internally threaded at 96 for screwing onto the external threads 86 of the socket wall. An alternative method for providing the internal threading 96 (FIG. 1) is shown at 96A in FIG. 2. The front housing 90 is made of sufficiently malleable and thin gauge metal, for example drawn aluminum, for enabling the threads 96A to be formed in the side wall 92.

In FIG. 1 the parallel heat dissipating fins 60 are seen endwise. In FIG. 2 these fins are seen broadside. It is to be noted that cutout regions 64 may be formed in these fins, if desired, for accommodating a more random flow pattern of the circulating liquid coolant.

During assembly the threaded stud 52 with its encircling seal 58 is inserted forwardly through the receptacle hole 29, and the jam nut 54 is screwed down tightly in place against the receptacle bottom panel or tray 28. Then, the hole 87 in the base member 80 is screwed onto the threads 56 of the stud 52 until the base flange 82 seats firmly against the jam nut 54. In the assembly method shown in FIG. 2, the next step is placement of a thin heat resistant electrically insulating disc 100 down into the socket 85. This insulating disc is preferred to be formed of ceramic for durability, for example alumina. The planar top surface 102 of the stud 52 projects slightly above the bottom of the socket 85 (as seen in FIG. 1) and thus serves as a heat-conducting seat against which the insulator disc 100 is firmly pressed for good extraction heat to flow down into the stud 52 and thence into the heat sink 50 and thence into the fins 60 for this extracted heat to dissipated into the circulating liquid in which these fins are bathed. For making electrical connection with the rear contacts of the solar cell 40, the terminal 42 is integral with a rear terminal member 110 having a peripheral annular ring 112 with a plurality of triangular fingers 114 extending inwardly from this ring 112. These fingers 114 are separated from each other by narrow slits 116. This rear terminal member 110 is formed of the same high electrical conductivity sheet copper as front terminal member 70. The cell 40 fits into a square opening 118 in an electrically insulating heat resistant alignment disc 120, and the rear terminal contact fingers 114 are connected to the rear contacts of the cell 40 by pressure and solder.

Advantageously, the alignment insulator 120 fits freely but precisely against the socket wall 84 for aligning the solar cell 40 with the concentrator axis 25 and also aligning with the bottom surface 38 of the secondary lens 30. The terminals 41 and 42 extend out through the notches 88 in the socket wall 84. In order to seal the socket 85 there is a gasket ring 122 which encircles the socket wall 84 and seats down onto the surface 89 of the base flange 82. As shown in FIG. 1, this gasket ring 122 seats over the terminals 41 and 42 adjacent to the notches 88 where these terminals exit from the socket 85. This gasket ring 122 is formed of heat resistant electrically insulating rubbery or yieldable material, for example such as EPDM elastomer, nylon, polyamide, or phenolic material. The threads 96 of the front housing 90 screw down onto the socket wall threads 86 with the lower edge of side wall 92 pressing down firmly onto the seal 122 while the internal lip 94 presses down onto the lens flange 36 for pressing the lens bottom surface 38 firmly down on cell 40. The secondary lens 30 is formed of optically transparent and heat-resistant glass, for example Pyrex glass. The alignment disc 120 is formed of heat resistant and degradation resistant material, for example of ceramic and preferably of alumina.

By virtue of the firm pressure of the bottom lens surface 38 on the cell 40, as caused by the gripping housing lip 94, the rear terminal 110 of high thermal conductivity is held firmly against the thin insulating disc 100 which in turn is held firmly against the planar heat sink surface 102. Thus, a good heat conduction path is provided from the cell 40 down into the heat sink surface 102 for cooling the cell while the sun's rays are being concentrated on its active front surface 44. It is noted that the rear terminal member 110, being formed of metal of high thermal conductivity advantageously serves as a heat spreader for conducting heat away from the rear of the cell 40 and for spreading this heat over a considerably larger area than the area of the cell body 46 and for conducting this heat into the disc 100.

For clarity of illustration in FIG. 2, the concentrator side walls 22, 24 and its bottom tray or panel 28 are omitted, and also the seal 58 and jam nut 54. The terminals 41 and 42 are split longitudinally by a median slit 124 so that the two parallel legs 125 of each terminal provide reliability by redundancy. Each terminal leg 125 is adapted for receiving crimped-on connector 128 for ease of interconnecting such solar concentrators 20 with other similar concentrators for creating arrays of concentrators using conventional and convenient electrical connectors and conventional insulated wiring, as contrasted with custom-made electrical bus bar arrangements.

The assembly arrangement used in FIG. 1 is the same as described above with reference mainly to FIG. 2, except that in FIG. 1 a relatively—thick heat spreader—disc 126 of high thermal conductivity—copper is placed between the—insulator disc 100 and the planar surface 102 of the heat sink pedestal 52.

Thus, the sealed enclosure 10 advantageously protects the cell 40 and the shiny internally reflective conical lens surface 34 from ambient air and water exposure. The encircling housing lip 94 gripping the lens flange 36 and firmly pressing down inherently provides alignment of the secondary lens 30 and cell 40 with each other and also serves to align both of them with the concentrator axis 25 for enabling more rapid and more consistent accurate alignment assembly of the cell and secondary lens. This sealed enclosure 10 packaging inhibits degradation of the cell and retards corrosion and oxidation of the cell and its contacts 76, 74. The bowed front contact fingers 74 and the numerous rear contact fingers 114 accommodate thermal expansion and contraction of the cell 40 while minimizing stress on the cell. Advantageously, the pre-punched hole 29 in the panel or tray 28 acting with the threaded stud 52 inserted therein mating in cooperation with the internally threaded axially concentric hole 87 in the cell-housing base member 80 serves to align the whole sealed enclosure with the primary lens axis 25 for enabling more rapid and more consistently accurate alignment of the whole solar concentrator 20. It will be appreciated that this sealed cell-holding enclosure 10 can be disassembled readily, if desired, for ease of cell replacement. The secondary lens 30 is arranged to provide substantially uniform light flux density across the active cell area 44 and compensates for slight tracking or aiming errors of the solar concentrator by virtue of the internally reflective cone surface 34 acting with the converging convex lens surface 32. In other words, this secondary lens provides significant off axis tracking capability because the usable secondary lens area is greater than the converged light spot of the primary lens. Also, this secondary lens reduces the chromatic aberration and lens flare effects. The practical effect of this secondary lens arrangement is more electrical power output over a given time span because of less critical tracking and optical corrections. The glass of this secondary lens is a firmly pressed-down cover which protects the cell from damaging radiation and from dirt and dust. The thermal mass of this glass prevents rapid temperature changes or thermal shock of the front cell surface 44 due to intermittent intense solar radiation when a cloud obstructs and then uncovers a summer sun and thus inhibits delamination and extends the operating life of this cell and its soldered front contacts 76.

Other changes and modifications varied to fit particular operating and installation requirements and environments will become apparent to those skilled in the art, and the invention includes all changes and modifications which not constitute a departure from the true spirit and scope of this invention as claimed in the following claims and reasonable equivalents to the claimed elements.

What we claim is:

1. In a solar concentrator wherein there is a cell with a front and a rear and wherein the concentrator has a primary lens spaced away from the front of said solar cell for converging the sun's rays toward the front of said solar cell, a cell-holder enclosure comprising:

a transparent secondary lens having an axis, said secondary lens having a convex front surface concentric with said axis and having a truncated conical rear surface concentric with said axis, said conical rear surface converging rearwardly and terminating in a generally flat bottom surface extending perpendicular to said axis, a base member of heat-resistant electrically insulating material having a forward wall defining an axially concentric socket therein, said base member being externally on said forward wall threaded concentric with said axis, said base member having a bottom surface with an internally threaded mounting hole concentric with said axis, said mounting hole communicating with said socket and with said bottom surface of the base member, a heat sink formed of metal of good thermal conductivity having a forwardly projecting pedestal which is externally threaded concentric with said axis, said pedestal screwing into said mounting hole and said pedestal having a heat-sink seat on its upper end, a photovoltaic cell, an alignment element having an opening therein for receiving said cell, said alignment element fitting freely but precisely into said socket for aligning the cell with said axis, first and second electrical contact members in electrically conductive relation with the cell and having first and second terminals extending generally radially in different directions, said forward wall having first and second clearance notches communicating with said socket for receiving said radially extending terminals, said cell-holder enclosure including a front housing having a lower end which is internally threaded adapted for screwing onto said externally threaded on said forward wall base member, and said front housing encircling said secondary lens and having an inturned front lip gripping said secondary lens near the periphery of said convex front surface for aligning the bottom surface of said secondary lens with the cell and for pressing said bottom surface firmly on the cell or pressing the cell downwardly toward said heat sink seat on the upper end of said pedestal for providing good thermal conductivity from said cell to said heat sink seat, and at least a thin heat resistant insulator between said heat sink seat and said cell.

2. In a solar concentrator as claimed in claim 1, wherein said solar concentrator has an axis and includes a pre-formed hole in a mounting panel, said cell-holder enclosure further comprising:

said pedestal fitting through said hole in said panel for mounting said cell-holder enclosure while aligning said pedestal with said axis of said.solar concentrator, thereby conveniently and inherently aligning the axis of said cell-holder enclosure with said axis of the solar 3. In a solar concentrator, the cell-holder enclosure as claimed in claim 2, in which:

a jam nut threads onto said pedestal for securing said pedestal in said mounting opening in said panel of the solar concentrator, and said bottom surface of said base member seats down upon said jam nut.

4. In a solar concentrator, the cell holder of claim 1, in which:

said secondary lens has a peripheral flange near the junction of its convex front and conical rear surfaces, and said inturned lip of said front housing grips and presses down on said peripheral flange.

5. In a solar concentrator, the cell-holder enclosure of claim 1, in which:

said base member has a radially projecting annular shoulder located below said forward wall, a seal encircles said forward wall, and said lower end of said front housing engages against said seal and presses said seal against said annular shoulder for sealing said cell-holder enclosure.

6. In a solar concentrator, the cell-holder enclosure of claim 5, in which:

said first and second radially extending terminals rest upon said annular shoulder, and said seal is pressed down upon said first and second radially extending terminals by said lower end of said front housing.

7. In a solar concentrator, the cell-holder enclosure of claim 6, in which:

said first and second radially extending terminals have median slits dividing each terminal into two parallel legs, and each of said legs has a crimped-on electrical terminal.

8. In a solar concentrator, the cell-holder enclosure of claim 1, in which:
   the front of said solar cell has an active area with a front electrical contact region extending around said active area,
   said first contact member is a front contact member having a peripheral region extending around said cell in front of said cell,
   said first radially extending terminal being connected to said peripheral region of said contact member,
   said front contact member including multiple fingers extending generally inwardly from said peripheral region and having tips soldered to said front electrical contact region of said cell, and
   said fingers are bowed upwardly in arched configuration for accommodating thermal expansion and contraction said cell and front contact member for minimizing mechanical stress on said cell and soldered contact fingers.

9. In a solar concentrator, the cell-holder enclosure of claim 8, in which:
   said multiple arched contact fingers have generally the appearance of an assemblage of spider legs.

10. In a solar concentrator, the cell-holder enclosure of claim 8, in which:
   said second contact member is a rear contact member having said second terminal extending radially therefrom, and
   said rear contact member is generally planar and has a multiplicity of slits therein extending radially providing a multiplicity of triangular contact fingers.

11. A cell-holder enclosure holding a photovoltaic cell for use in a solar concentrator having a primary lens spaced away from the front of said solar cell for converging the sun's rays toward tne front of said solar cell, said cell-holder enclosure comprising:
   a transparent secondary lens having an axis,
   said secondary lens having a convex front surface concentric with said axis and having a truncated conical rear surface concentric with said axis,
   said conical rear surface converging rearwardly and terminating in a generally flat bottom surface extending perpendicular to said axis,
   a base member of heat-resistant electrically insulating material having a forward wall defining an axially concentric socket therein,
   said base member forward wall of said being externally threaded concentric with said axis,
   said base member having a bottom with an internally threaded mounting hole concentric with said axis,
   said mounting hole communicating with said socket and with said bottom of the base member,
   a heat sink formed of metal of good thermal conductivity having a forwardly projecting pedestal which is externally threaded concentric with said axis,
   said pedestal screwing into said mounting hole and said pedestal having a heat-sink on its upper end,
   an alignment element having an opening therein having a photovoltaic cell therein,
   said alignment element fitting freely but precisely into said socket for aligning the cell with said axis,
   first and second electrical contact members in electrically conductive relation with the cell and having first and second terminals extending generally radially in different directions,
   said forward wall having first and second clearance notches communicating with said socket for receiving said radially extending terminals,
   at least a thin heat resistant insulator between heat sink seat and said cell,
   said cell-holder enclosure including a front housing having a lower end which is internally threaded adapted for screwing onto said externally threaded base member, and
   said front housing encircling said secondary lens and having an inturned front lip gripping said secondary lens near the periphery of said convex front surface for aligning the bottom surface of said secondary lens with the cell and for pressing said bottom surface firmly on the cell for pressing the cell downwardly toward said thin insulator and heat sink seat on the upper end of said pedestal for providing good thermal conductivity from said cell to said heat sink seat.

* * * * *